United States Patent [19]

Hanna

[11] Patent Number: 4,591,830
[45] Date of Patent: May 27, 1986

[54] COMPARATOR CELL FOR ANALOG-TO-DIGITAL FLASH CONVERTER

[75] Inventor: John E. Hanna, Mesa, Ariz.

[73] Assignee: Motorola, Inc., Schaumburg, Ill.

[21] Appl. No.: 671,646

[22] Filed: Nov. 15, 1984

[51] Int. Cl.$^4$ ............................................. H03K 13/02
[52] U.S. Cl. ............................................. 340/347 AD
[58] Field of Search ................... 340/347 AD, 347 M; 307/494, 495, 487, 350, 360, 361

[56] References Cited

U.S. PATENT DOCUMENTS

| | | | |
|---|---|---|---|
| 4,195,235 | 3/1980 | Schoeff | 340/347 NT |
| 4,232,302 | 11/1980 | Jagatich | 340/347 AD |
| 4,386,339 | 5/1983 | Henry et al. | 340/347 AD |
| 4,532,438 | 7/1985 | Reiner | 340/347 AD |

OTHER PUBLICATIONS

IEEE Journal of Solid State Circuits, vol. SC-14, No. 6, Dec. 1979, pp. 938–943.
Thomson-CSF Data Sheet, ESM 362A, 79-07, Jul. 1979.

Primary Examiner—Vit W. Miska
Attorney, Agent, or Firm—William E. Koch

[57] ABSTRACT

A comparator cell for analog-to-digital flash converters is provided that reduces power dissipation and peak voltage drop across a load while improving accuracy. An even number of level sensors are coupled to receive an analog input signal and provide a first and a second current. Each level sensor is biased by a different reference voltage. Means for receiving the first and second current and providing an output is coupled between the level sensors and a pair of load resistors. The load resistors are manufactured in a predetermined resistance ratio depending on the number of level sensors.

9 Claims, 4 Drawing Figures

COMPARATOR CELL FOR ANALOG-TO-DIGITAL FLASH CONVERTER

BACKGROUND OF THE INVENTION

1. Field of the Invention

This invention relates in general to a comparator cell for analog-to-digital flash converters and, more particularly, to a comparator cell that reduces power dissipation and peak voltage drop across a load while improving accuracy.

2. Background Art

Circuitry for converting analog signals into corresponding equivalent digital signals has a multiplicity of uses in present day instrumentation and telemetry equipment. When all bits of the digital output are determined simultaneously from the analog voltage, the method is referred to as the parallel method or flash encoding method. This method refers to a plurality of parallel comparators wherein each comparator is responsive to the analog voltage attaining a predetermined voltage level.

A flash encoding converter has $2^N$ digital output states for an N-bit encoder where N is a predetermined integer. A peak analog voltage is divided into $2^N$ levels wherein each level is represented by one of the digital output states representable with an N bit digital word. A conventional N-bit encoder requires $2^N-1$ comparators which is prohibitive when N is large (i.e., six). Furthermore, the output from the parallel bank of voltage comparators is in the form of $2^N-1$ binary data signals. These outputs are typically encoded to N bits of binary information by conversion logic. This requires a prohibitively large number of elements in the conversion logic.

One known flash analog-to-digital converter that overcomes these disadvantages is described in U.S. Pat. No. 4,386,339 which is incorporated herein by reference. This referenced patent provides a direct flash converter having a comparator cell with independent parallel analog-to-digital encoders for each bit. Each independent bit-encoder has cross-coupled level sensors coupled to a single comparator such that the output of the comparator is a directly encoded compact binary output. Thus, only one comparator is required for each bit, and the need for conversion logic is eliminated, resulting in a practical, direct multi-bit flash converter. For even larger values of N, some conversion is required, but still less than with conventional techniques.

However, these cross-coupled level sensors comprise differentially coupled transistor pairs wherein one base is coupled for receiving an analog input signal and the other base is coupled for receiving a threshold voltage. The collectors on each side of each level sensor are coupled together, alternately directly coupled and cross-coupled to form two collector current paths. These two current paths, in turn, are each tied to one of the emitters of a pair of transistors whose bases are commonly tied. The current through these two current paths is directed through two load resistors having equal resistance which provides a voltage differential as an output of the comparator cell. For each comparator cell containing an even number of level sensors, a current source is coupled to the emitter of one of the pair of transistors for providing additional current to one of the current paths. This additional current source increases power dissipation of the circuit, requires alpha compensation circuitry, produces additional load voltage drop and therefore a larger supply voltage, and decreases accuracy since errors in the current source current are reflected back as errors in the level sensor.

Thus, a need exists for an improved flash converter having a comparator cell that has decreased power dissipation, increased accuracy, requires a lower supply voltage, and does not require additional circuitry for alpha compensation.

SUMMARY OF THE INVENTION

Accordingly, it is an object of the present invention to provide an improved analog-to-digital converter.

Another object of the present invention is to provide a comparator cell for an analog-to-digital converter having reduced power dissipation.

Yet another object of the present invention is to provide a comparator cell for an analog-to-digital converter having increased accuracy.

Still another object of the present invention is to provide a comparator cell for an analog-to-digital converter that requires less supply voltage.

In carrying out the above and other objects of the invention in one form, there is provided a comparator cell for an analog-to-digital converter comprising an even number of level sensors coupled to receive an analog input signal. Each one of the level sensors is coupled to receive a reference voltage, wherein the current from each level sensor is summed into a first or a second current depending upon the reference voltage for this level sensor compared to the reference voltage for other level sensors within this comparator cell. Output means are coupled between the level sensors and a first and second load resistor for providing an output representative of the amplitude of the analog input signal.

The above and other objects, features, and advantages of the present invention will be better understood from the following detailed description taken in conjunction with the accompanying drawings.

DETAILED DESCRIPTION OF THE INVENTION

A flash converter that includes the comparator cell of the present invention is a simultaneous N bit analog-to-digital converter. The binary code typically incorporated in the flash converter is a cyclic code sometimes referred to as a Gray code. The states of a four-bit Gray code as a function of quantized input voltages are illustrated as follows:

| GRAY CODE | QUANTIZED INPUT VOLTAGE AMPLITUDE |
|---|---|
| 0000 | 0 |
| 0001 | 1 |
| 0011 | 2 |
| 0010 | 3 |
| 0110 | 4 |
| 0111 | 5 |
| 0101 | 6 |
| 0100 | 7 |
| 1100 | 8 |
| 1101 | 9 |
| 1111 | 10 |
| 1110 | 11 |
| 1010 | 12 |
| 1011 | 13 |
| 1001 | 14 |
| 1000 | 15 |

Figure 1:
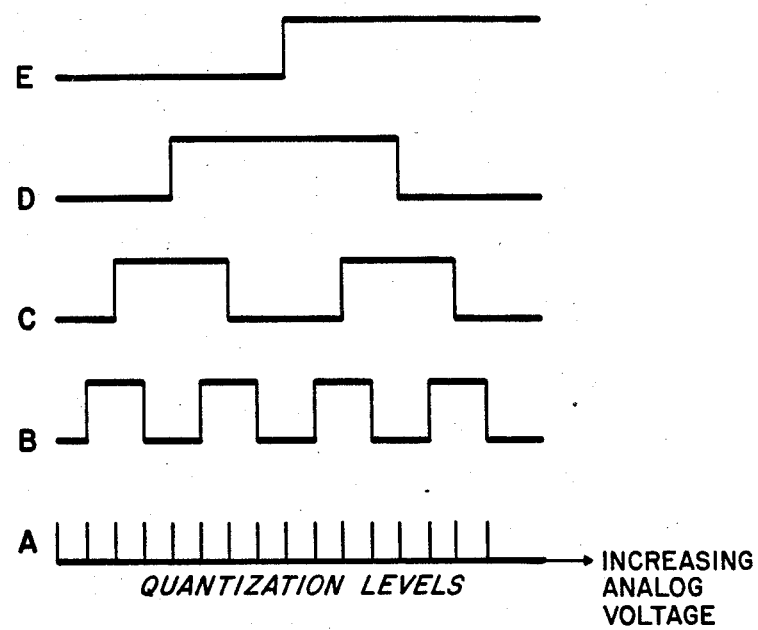
FIG. 1 illustrates waveforms associated with the Gray code bit values as a function of analog input voltage.

FIG. 1 illustrates digital waveforms associated with these Gray code bit values as a function of increasing analog input voltage. Waveform A identifies the quantization levels of the analog input voltage. Waveforms B, C, D and E represent the least significant bit, the next least significant bit, etc., respectively, of the Gray code shown above. It is seen that only one bit of the code changes state as the analog input voltage increases to one of the quantization levels.

Figure 2:
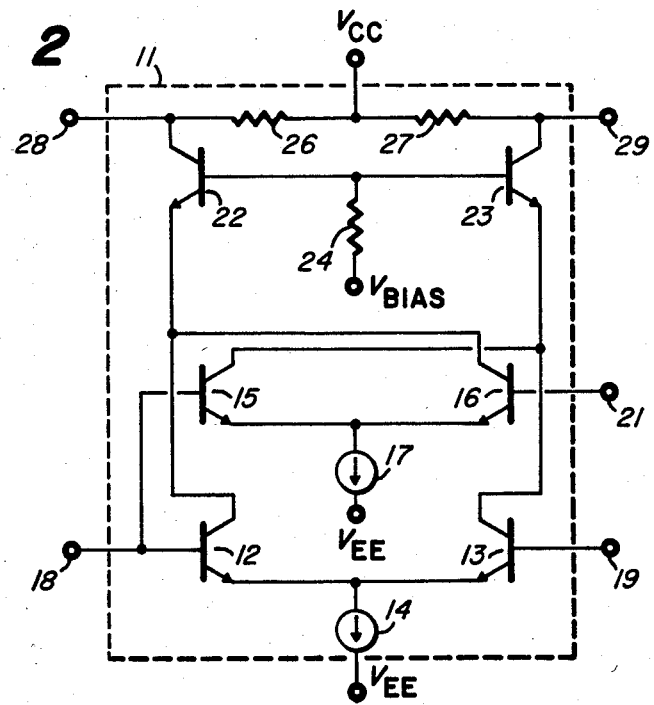
FIG. 2 is a schematic diagram of a comparator cell having two level sensors in accordance with the teachings of the present invention.

Referring to FIG. 2, comparator cell 11 is responsive to an analog input signal on input terminal 18 and provides an output signal on output terminals 28 and 29 depending on the amplitude of the analog input signal in relation to reference voltages on terminals 19 and 21. Comparator cell 11 comprises differentially coupled level sensor transistors 12 and 13 having their emitters coupled to voltage source $V_{EE}$ by current source 14. Differentially cross-coupled level sensor transistors 15 and 16 have their emitters coupled to voltage source $V_{EE}$ by current source 17. Current sources 14 and 17 provide a substantially equal current. Transistors 12 and 15 have their bases connected to input terminal 18 for receiving the analog input voltage. Transistors 13 and 16 have their bases connected to reference voltage terminals 19 and 21, respectively, for biasing the respective transistor as compared to the analog input voltage. The reference voltage on terminal 21 is greater than the reference voltage on terminal 19 for reasons described hereinafter. These two transistor pairs function as level sensors for supplying current to either load resistor 26 or 27 when the analog input signal reaches a predetermined amplitude. The invention described herein applies equally well for any even number of level sensors.

Transistors 22 and 23 have their bases connected together and coupled to bias voltage $V_{BIAS}$ by resistor 24, and their collectors coupled to supply voltage $V_{CC}$ by load resistors 26 and 27, respectively. The emitter of transistor 22 is connected to the collectors of transistors 12 and 16 and the emitter of transistor 23 is connected to the collectors of transistors 13 and 15. The collectors of transistors 22 and 23 are further connected to output terminals 28 and 29, respectively.

When the analog input signal on input terminal 18 is more negative than the reference voltages on terminals 19 and 21, transistors 13 and 16 will conduct and current will flow from current source 14 through transistors 13 and 23 to load 27 and from current source 17 through transistors 16 and 22 to load 26. Since the current sources produce equal currents, the loads receive equal currents.

As the analog input signal on input terminal 18 increases above the reference voltage on terminal 19, transistor 12 conducts current from current source 14 through transistor 22 to load resistor 26. If the analog input voltage has not increased above the reference voltage on terminal 21, current still flows from current source 17 through transistors 16 and 22. The value of resistors 26 and 27 are in the ratio if $(M-1)/(M+1)$ where M is the number of level sensors in the comparator cell. In this case, M=2 and the resistance of resistor 26 divided by the resistance of resistor 27 equals $\frac{1}{3}$. Because the currents in the loads are equal, the voltage drops across the loads are in a 1:3 ratio producing a voltage output across terminals 28 and 29 of the difference $(1-3)=-2$ units.

If the analog input equals the reference voltage on terminal 19, the current from current source 14 is split equally between transistors 12 and 13 and between transistors 22 and 23 and between loads 26 and 27. The current from current source 17 flows through transistors 16 and 22 to load 26. The load currents through resistors 26 and 27 are thus in a ratio of 1 $\frac{1}{2}:\frac{1}{2}$ or 3:1. Since the resistors are in a ratio of 1:3, the voltage drops thereacross are equal and the differential output is zero. If the analog input voltage is midway between the reference voltages on terminals 19 and 21 and these voltages are sufficiently different, the current from current source 14 flows through transistors 12 and 22 to load resistor 26. The current from current source 17 flows through transistors 16 and 22 to load resistor 26. Thus, two units of current flow through one unit of resistance to produce two units of voltage drop across resistor 26. With no current flowing through resistor 27, the drop across it is zero, and the differential output voltage is $(2-0)=+2$ units. Thus, by judicious choice of load resistor ratios, the differential output can be made symmetric and have zerodifferential output for zero differential input (voltage at input terminal 18 equal to the reference voltage at terminal 19).

Similarly, when the input voltage at input terminal 18 equals the reference voltage at terminal 21, the current from current source 17 splits equally through transistors 15 and 16, and transistors 22 and 23 and load resistors 26 and 27. Current from current source 14 flows through transistors 12 and 22 to load 26. Thus, the ratio of currents through load resistors 26 and 27 is 1 $\frac{1}{2}:\frac{1}{2}$ or 3:1 and the differential output voltage is again zero for zero differential input voltage (voltage at input terminal 18 equal to the reference voltage at terminal 21).

As the analog input signal on input terminal 18 increases above the reference voltages on both terminals 19 and 21, transistors 12 and 15 conduct and current flows from current source 14 through both transistors 12 and 22 and load resistor 26, and from current source 17 through transistors 15 and 23 and load resistor 27. The currents through load resistors 26 and 27 are in a 1:1 ratio, so that the voltage drops across them are in a 1:3 ratio and the differential output voltage is $(1-3)=-2$ units.

Figure 3:
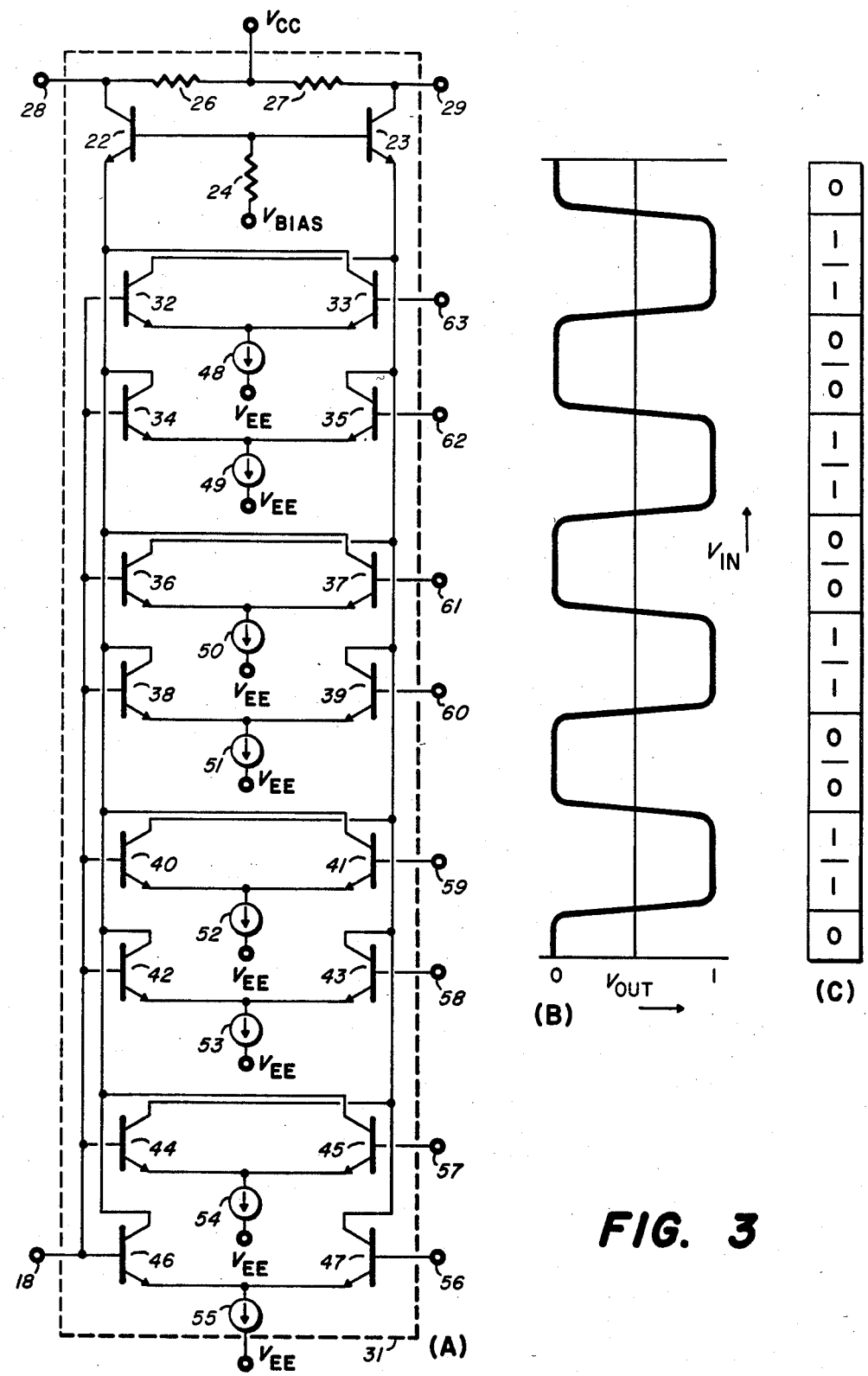
FIG. 3(a) is a schematic diagram of a comparator cell having eight level sensors in accordance with the teachings of the present invention.
FIG. 3(b) illustrates the output analog voltage provided by the comparator cell of FIG. 3(a).
FIG. 3(c) illustrates the digital output associated with the analog voltage of FIG. 3(b).

Referring to FIG. 3(A), a comparator cell 31 is shown comprising eight level sensors (M=8) comprising transistors 32 and 33, 34 and 35, 36 and 37, 38 and 39, 40 and 41, 42 and 43, 44 and 45, and 46 and 47. The remaining devices within comparator cell 31 are similar to the devices of comparator cell 11 of FIG. 2 and are so numbered. This parallel bank of level sensors are connected similarly to those of FIG. 2 and operate in a similar manner. Current sources 48, 49, 50, 51, 52, 53, 54, and 55 are also similar to current sources 14 and 17 of FIG. 2 and operate in a similar manner. Reference voltage terminals 56, 57, 58, 59, 60, 61, 62, and 63 have a voltage amplitude applied thereto that increases with each terminal. The ratio of the values of load resistors 26 and 27 is $(8-1)/(8+1)=7/9$.

The output signal on terminals 28 and 29 is illustrated in FIG. 3(B) as a function of a monotonically increasing input analog signal. This output signal passes through zero voltage in response to the input analog signal being substantially equal to one of the reference voltages. The resulting digital output signal for amplifier cell 31 is illustrated in FIG. 3(C).

In operation, the amplitude of the analog input signal at one side of the level sensors in relation to the reference voltages at the other side of the level sensors determines which of the level sensors provide current to transistor 22 and which of the level sensors provide current to transistor 23. The resistance of load resistors 26 and 27 are at a ratio of 7:9 in order to provide the proper output differential at terminals 28 and 29. For a comparator cell having two level sensors, removing the dummy current source of the circuit taught in the patent incorporated herein provides a 33% decrease in current from the comparator cell. For a comparator cell having four level sensors, removing the dummy current source provides a 20% decrease in current. For a comparator cell having eight level sensors, removing the dummy current source provides a 12% decrease in current.

Figure 4:
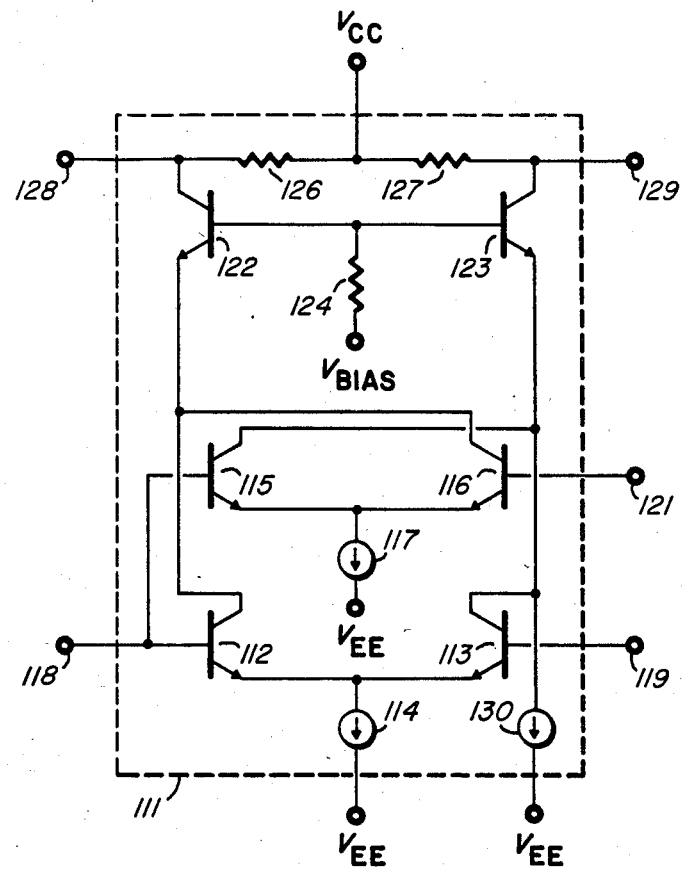
FIG. 4 is a schematic diagram of a comparator cell in accordance with the prior art.

A schematic of an embodiment described in the patent incorporated herein is shown in FIG. 4 and comprises dummy current source 130 coupled between the emitter of transistor 123 and voltage source $V_{EE}$, in addition to devices similar to those in FIG. 2. For ease of understanding, the devices of FIG. 4 are identified with a number 100 larger than similar devices of FIG. 2. The referenced circuit of FIG. 4 produces outputs that for an equal differential output voltage swing are additionally offset in value due to the current in dummy differential amplifier 130. For a voltage at input terminal 118 more negative than either reference voltages at terminals 119 or 121, current from current source 114 is conducted through transistors 113 and 123 to load resistor 127, and current from current source 117 is conducted through transistors 116 and 122 to load resistor 126. The current from current source 130 is nominally equal to that from the collector of transistor 113 so that the ratio of currents in load resistors 126 and 127 is 1:2. The values of load resistors 126 and 127 are equal and thus produce voltage drops in the ratio 1:2 also for a differential output voltage of $(1-2)=-1$ units. When the input voltage on terminal 118 equals the reference voltage on terminal 119, the current from current source 114 splits equally through transistors 112 and 113, and through transistors 122 and 123, and through load resistors 126 and 127. Current from current source 117 flows through transistors 116 and 122 to load resistor 126. Current from dummy current source 130 flows through transistor 123 to load resistor 127. The ratio of currents in load resistors 126 and 127 is thus 1 ½:1 ½ and with equal valued load resistors, the currents produce equal voltage drops in both load resistors and zero differential output. It can be shown that for an input voltage at terminal 118 between reference voltages at terminals 119 and 121, that the ratio of currents in load resistors 126 and 127 is 2:1 and the differential output is $(2-1)=1$ unit. It can be further shown that if the voltage at the input terminal 118 equals the voltage at terminal 121 that the differential output voltage is zero.

In order to compare the type of information above for the invention described herein and the patent incorporated herein, the data must be normalized. One convenient approach of normalizing is to define that the current sources are equal and the total load resistances are equal, i.e., that $(R_{126}+R_{127})=(R_{26}+R_{27})$. As used herein, R, V and I represent resistance, voltage and current values, respectively, of the devices identified by the suffix numbers. Then, for convenience, further define that $R_{126}=R_{127}=R_L$. Thus, $R_{26}+R_{27}=2R_L$ and since $R_{26}/R_{27}=1/3$, then $R_{26}=2R_L/3$ and $R_{27}=2R_L$.

This information may be summarized in the matrix as follows (where $V_{OUT}=V_{R126}-V_{R127}$):

| FOR/THEN | $I_{R126}$ | $I_{R127}$ | $V_{R126}$ | $V_{R127}$ | $V_{OUT}$ |
|---|---|---|---|---|---|
| $V_{118}<<V_{119}$ | 1 | 2 | 1 | 2 | −1 |
| $V_{118}=V_{119}$ | 1½ | 1½ | 1½ | 1½ | 0 |
| $V_{119}<<V_{118}<<V_{121}$ | 2 | 1 | 2 | 1 | 1 |

| FOR/THEN | $I_{R26}$ | $I_{R27}$ | $V_{R26}$ | $V_{R27}$ | $V_{OUT}$ |
|---|---|---|---|---|---|
| $V_{18}<<V_{19}$ | 1 | 1 | ⅔ | 2 | −1⅓ |
| $V_{18}=V_{19}$ | 1½ | ½ | 1 | 1 | 0 |
| $V_{19}<<V_{18}<<V_{21}$ | 2 | 0 | 1⅓ | 0 | 1⅓ |

It may be noted that the peak voltage drop across $R_{126}$, $R_{127}$ or $R_{27}$ is 2 in both cases, but that the differential output voltage $V_{OUT}$ is 25% higher for the new circuit. Conversely, the same differential voltage swing may be obtained with a 25% reduction in peak load voltage for the new circuit. This means that a lower supply voltage may be used with the new circuit to achieve the same differential output voltage.

In the circuit of FIG. 4, the dummy current source 130 must be carefully matched to the other current sources in the comparator cell since it is contributing directly to the load voltage developed across resistor 127. Mismatches in the practical circuit elements of that circuit will cause non-ideal matching which will result in a voltage different than ideal across resistor 127. The worst error condition occurs when the differential output voltage between terminals 128 and 129 is supposed to be zero. In this condition, the error voltage produced by the dummy current source 130 dominates the differential output. The invention described herein does not require this current source, thereby removing this source of error.

By now it should be appreciated that there has been provided a comparator cell for an analog-to-digital converter that reduces power dissipation and peak voltage drop across a load while improving accuracy.

The above description is given by way of example only. Changes in form and details may be made by one skilled in the art without parting from the spirit and scope of the invention.

I claim:

1. A comparator cell for an analog-to-digital converter comprising:

an even number of level sensors coupled to receive an analog input signal, each one of said level sensors coupled to receive a different reference voltage, said level sensors providing a first and a second current; and means coupled to said level sensors for providing an output and comprising a first load coupled for receiving said first current and a second load coupled for receiving said second current, said first and second loads having a resistance ratio of $(M-1)/(M+1)$ where M is the number of said level sensors.

2. The comparator cell according to claim 1 wherein said means for providing an output comprises:
   a first load resistor having said first current passing therethrough;
   a second load resistor having said second current passing therethrough, said first and second load resistors providing said resistance ratio; and
   transistor means coupled between said level sensors and said first and second load resistors for providing said output.

3. The comparator cell according to claim 2 wherein said transistor means comprises:
   a first transistor having its collector-emitter path coupled between said plurality of level sensors and said first load resistor; and
   a second transistor having its collector-emitter path coupled between said plurality of level sensors and said second load resistor, said first and second transistor having bases coupled to receive a bias voltage, said collector of said first transistor coupled to a first output terminal and said collector of said second transistor coupled to a second output terminal.

4. The comparator cell according to claim 3 wherein said level sensors comprise a plurality of differentially coupled transistor pairs having their collectors on each side of each of said level sensors coupled together, alternately directly coupled and cross-coupled to form a first current path for said first current and a second current path for said second current.

5. The comparator cell according to claim 4 wherein said level sensors comprises:
   a first differentially coupled transistor pair comprising:
     a third transistor having a base coupled to receive said input signal and a collector-emitter path coupled to said collector-emitter path of said first transistor; and
     a fourth transistor having a base coupled to receive a first reference voltage and a collector-emitter path coupled to said collector-emitter path of said second transistor; and
   a second differentially coupled transistor pair comprising:
     a fifth transistor having a base coupled to receive said input signal and a collector-emitter path coupled to said collector-emitter path of said second transistor; and
     a sixth transistor having a base coupled to receive a second reference voltage and a collector-emitter path coupled to said collector-emitter path of said first transistor.

6. An analog-to-digital converter comprising:
   a plurality of comparator cells coupled to receive an analog input signal, each of said comparator cells comprising:
     means for sensing the level of said analog input signal and providing a first and second current representative of said analog input signal; and
     means for providing an output coupled to said level sensing means comprising a first load coupled for receiving said first current and a second load coupled for receiving said second current, said first and second loads having a resistance ratio of $(M-1)/(M+1)$ where M is the number of said level sensors; and
   means coupled to said plurality of comparators cells for sampling and latching each of said comparator cells output signals and providing a plurality of digital output signals.

7. The analog-to-digital converter according to claim 6 wherein said output means comprises:
   a first load resistor having said first current passing therethrough;
   a second load resistor having said second current passing therethrough, said first and second load resistors providing said resistance ratio; and
   transistor means for providing a comparator cell output signal coupled between said sensing means and both said first and second load resistors.

8. The analog-to-digital converter according to claim 7 wherein said transistor means comprises:
   a first transistor having its collector-emitter path coupled between said plurality of level sensors and said first load resistor; and
   a second transistor having its collector-emitter path coupled between said plurality of level sensors and said second load resistor, said first and second transistor having bases coupled to receive a bias voltage, said collector of said first transistor coupled to a first output terminal and said collector of said second transistor coupled to a second output terminal.

9. The analog-to-digital converter according to claim 7 wherein said level sensors comprises:
   a first differentially coupled transistor pair comprising:
     a third transistor having a base coupled to receive said input signal and a collector-emitter path coupled to said collector-emitter path of said first transistor; and
     a fourth transistor having a base coupled to receive a first reference voltage and a collector-emitter path coupled to said collector-emitter path of said second transistor; and
   a second differentially coupled transistor pair comprising:
     a fifth transistor having a base coupled to receive said input signal and a collector-emitter path coupled to said collector-emitter path of said second transistor; and
     a sixth transistor having a base coupled to receive a second reference voltage and a collector-emitter path coupled to said collector-emitter path of said first transistor.

* * * * *